United States Patent [19]
Manako et al.

[11] Patent Number: 5,402,434
[45] Date of Patent: Mar. 28, 1995

[54] ER:YVO₄ LASER OSCILLATOR, SOLID-STATE LASER MATERIAL AND METHOD FOR MANUFACTURING THE SAME

[75] Inventors: Shoko Manako; Seiichi Saito; Yasuhiko Kuwano, all of Tokyo, Japan

[73] Assignee: Nec Corporation, Tokyo, Japan

[21] Appl. No.: 132,304

[22] Filed: Oct. 6, 1993

[30] Foreign Application Priority Data

| | | |
|---|---|---|
| Oct. 7, 1992 [JP] | Japan | 4-268891 |
| Jan. 13, 1993 [JP] | Japan | 5-003709 |
| Jan. 20, 1993 [JP] | Japan | 5-007125 |
| May 11, 1993 [JP] | Japan | 5-108654 |

[51] Int. Cl.⁶ .............................................. H015 3/16
[52] U.S. Cl. ................................. 372/41; 372/6; 372/27; 372/69; 372/99
[58] Field of Search ................... 372/41, 6, 27, 69, 70

[56] References Cited

FOREIGN PATENT DOCUMENTS 63-81994  4/1988  Japan .

OTHER PUBLICATIONS

"Efficient 1.94-um Tm³⁺ laser YVO₄ Host", Optical Letters, vol. 17, No. 3, Feb. 1, 1992, By H. Saito et al., pp. 189–191.

Electronic Letters, vol. 25, No. 20, Sep.28, 1989, pp. 1389-1391.

"Upconversion -pumped 2.8–2.9-um lasing of Er³⁺ ion in Garnets", Journal of Applied Physics, vol. 70, No. 12, Dec. 15, 1991, By S. Pollack et al., pp. 7227–7239.

"Efficient, broadly tunable, laser14 pumped Tm:YAG and Tm:YSGG" Optical Letters, vol. 15, No. 9, May 1, 1990, By R. Stoneman et al., pp. 486–488.

"Time-resolved coherent and incoherent components of forward light scattering i random media", Optical Letters, vol. 15, No. 6, Mar. 15, 1990, By K. Yoo et al., pp. 320–322.

"Extended Abstracts—The 52nd Autumn Meeting, 1992—" The Japan Society of Applied Physics, 11p–M-4, Oct, 9, 1991, No. 3, with partial translation.

"The Spectra of the Doubly and Triply Ionized Rare Earths", Applied Optics, vol. 2, No. 7, Jul. 1963, By G. Dieke et al., pp. 675–686.

Primary Examiner—Léon Scott, Jr.
Attorney, Agent, or Firm—Young & Thompson

[57] ABSTRACT

An Er:YVO₄ laser oscillator has an excitation light source constituted by a laser diode and a medium constituted by an Er:YVO₄ crystal in which Er³⁺ ions are activators and YVO₄ is a host material. The oscillation light is perpendicular or parallel to c-axis of the crystal. The laser operates in target wavelengths on energy transitions of the Er³⁺ ions, the target wavelengths being 510 nm to 590 nm, 840 nm to 870 nm, 970 nm to 1020 nm, and 1450 nm to 1700 nm. The crystal is coated with a TiO₂—SiO₂ system high reflection mirror coating and a fluoride megnesium-zeolite system antireflection coating corresponding to the target wavelengths and a fluoride megnesium-zeolite system antireflection coating corresponding to the wavelength of the laser diode. These coatings together with an output mirror constitute a resonator. For manufacturing the crystal, Er₂O₃, Y₂O₃, and V₂O₅ used as starting materials are subjected to a Czochralski growth process using a high frequency induction heating furnace with the direction of growth being in an a-axis. This is followed by a thermal treatment under a temperature in the neighborhood of a growth temperature or a thermal treatment in an oxygen atmosphere. It has been made possible to produce a single laser crystal of YVO₄ with an improved quality and enhanced yield.

11 Claims, 8 Drawing Sheets

ER:YVO₄ LASER OSCILLATOR, SOLID-STATE LASER MATERIAL AND METHOD FOR MANUFACTURING THE SAME

BACKGROUND OF THE INVENTION (1) Field of the Invention

The present invention relates to a solid-state laser oscillator and a solid-state laser material for use therein, and a method for manufacturing such material, and more particularly to an Er:YVO₄ (erbium: yttrium orthovanadate) laser oscillator, a solid-state laser material used therein, and a method for manufacturing the same.

(2) Description of the Related Art

In recent years, there is a high demand for a shortwave laser in the field of applications such as writing/reading on optical disks and laser-machining or processing. Today, a gas laser is in use as a shortwave laser which has a problem associated with its maintenance and increased device scale or size, which leads to a demand for the development of a solid state type device. With this as background, research is in progress for the development of a solid state-shortwave laser device, and there are reports on such laser devices. In one of such devices, with the solid-state laser including an Nd³⁺ activator, a laser of 1064 nm by energy transitions $^4F_{3/2} \rightarrow {}^4I_{11/2}$ of Nd³⁺ ions (neodymium ions) and a non-linear optical crystal are combined to provide a second harmonic generation of 532 nm, and in another of such devices, the same shortwaves are provided by a laser crystal which itself has non-linear optical effects. Also, in an up-conversion laser device which is being recently researched, such ions as Ho³⁺ ions and Pr³⁺ ions are mixed in glass or fluoride crystal whereby laser oscillation of a 500 nm band is obtained ("Applied Physics" of 1992, Vol. 61, 43 p). Other reports include a report in which, with Nd³⁺ ions as activators, the oscillation takes place at a 950 nm band by utilizing energy transitions $^4F_{3/2} \rightarrow {}^4I_{9/2}$ of Nd³⁺ ions (for example, "IEEE Journal of Quantum Electronics" of 1987, Vol. QE-23, 605 p), and a report on a recently developed variable wavelength laser device representative of Ti:Al₂O₃ laser ("O plus E" of 1988, No. 102, 119 p).

As a laser in which a host material is YVO₄, the most common is a 1.06 μm laser device with an Nd activator. Other reports include one on a Tm activated laser ("Optics Letters" of 1992, Vol. 17, 189 p).

As a host material in a laser device with an Er activator, the reported examples include glass (Japanese Patent Application Kokai No. S63-81994), YLiF₄ ("Electronics Letters" of 1989, Vol. 25, 1389 p), Y₃Al₅O₁₂ and Y₃Sc₂Ga₃O₁₂ ("Journal of Applied Physics" of 1991, Vol. 70, 7227 p).

However, the reported shortwave solid-state laser devices as above have encountered the following problems. That is, since the harmonic generation is produced by combining the laser oscillation and the non-linear optical effects with the wavelength conversion step being processed through, there have occurred substantial conversion losses. Also, in the up-conversion laser, the oscillation spectral line width is large when the glass is a host material, and the growth of fluoride crystal, especially for the growth environment, requires more care than that for the growth of the oxide crystal. Further, in the laser which utilizes the energy transitions $^4F_{3/2} \rightarrow {}^4I_{9/2}$ of Nd³⁺ ions, since this is a three-level laser, there are problems such as high oscillation threshold, low oscillation efficiency, and low oscillation strength. In the variable wavelength laser, often a gas laser which is large and has maintenance problem is used as an excitation source and this inevitably makes the overall laser system large and complex. With respect to the laser which utilizes $^4F_{3/2} \rightarrow {}^4I_{9/2}$ of Nd³⁺ ions, there has been found no report wherein YVO₄ crystal capable of performing highly efficient oscillation is used as a laser host material. This may be because, with the YVO₄, the central wavelength of the luminescent characteristics of 950 nm band of Nd in the crystal deviates and overlaps the wavelength band in which absorption coefficient is large, resulting in excited state absorption.

An Er glass laser or an Er:YLiF₄ laser making use of an Er activator is a shortwave laser but, where the host material is glass, there are such problems that an oscillation wavelength profile is broad and that, since glass containing high concentration Er is difficult to produce, a large glass laser is required resulting in an increase in the size of the device. On the other hand, where the host material is YLiF₄, a problem is accompanied in the crystal growth as it requires extra care in its growth environment.

The second aspect of the invention relates to a solid-state laser device operable in an eye-safe region.

In recent years, there is a desire for the realization of a laser used in an atmosphere to be operable in an eye-safe region, and development of such a laser device is in progress. As the lasers that operate in eye-safe regions, the reports known to the inventors include a Tm laser operated in 1.87–2.14 μm ("Optics Letters" of 1990, Vol. 15, 486 p); an Ho laser operated at 2.1 μm ("Optics Letters" of 1990, Vol. 15, 320 p); an optic parametric oscillation of 700–2200 nm at 1.6 μm by a second harmonic generation (532 nm) of Nd laser and a nonlinear crystal LiNbO₃ (Extended Abstracts—The 52nd Autumn Meeting, 1992—The Japan Society of Applied Physics, 11 p-M-4).

However, the prior art eye-safe lasers have suffered from the following problems. That is, while the most appropriate wavelength for the eye-safe region is 1.5 μm or its vicinity, the Tm laser or Ho laser used in the prior art deviates from such wavelength band. Also, since the optic parametric oscillation undergoes nonlinear optical effects twice, the conversion losses are inevitable and the oscillation intensity is very weak.

The oscillation wavelength of the Er glass laser is 1.5 μm which is within the eye-safe region but, since the laser host is glass, there are such problems that an oscillation wavelength profile is broad and that, since glass containing high concentration Er is difficult to produce, a large glass laser is required resulting in an increase in the size of the device and also in a reduced heat resistance. On the other hand, the oscillation wavelength of other Er activating lasers fall outside the eye-safe region.

The third aspect of the invention relates to a solid-state laser material and a method for manufacturing such material.

Conventionally, a YAG laser has been typically used as a solid-state laser material. The laser which has improved the YAG laser in the aspect of laser oscillation efficiency is a YVO₄ laser. The reason that the YVO₄ laser is highly efficient is attributable to the facts that, as compared with the YAG crystal, the YVO₄ crystal has a broader light absorption spectrum with high absorption rate of excitation, and that the intensity of luminescent characteristics is great.

However, in the conventional YVO$_4$ laser described above, the activator has employed only Nd and this has presented the problem that the oscillation cannot be obtained other than at the oscillation wavelength of 1.06 μm. However, in recent years, there are demands, on one hand, for shortwave lasing for applications such as for meeting changes from a gas laser, and enhancing higher density of optical disks and higher precision in laser machining and processing and, on the other hand, for long-wave lasing for eye-safe purposes.

Conventionally, it has not been easy to grow YVO$_4$ crystals and there have been desires for the availability of an improved crystal growth method capable of growing a single crystal of good quality.

SUMMARY OF THE INVENTIONS

Accordingly, an object of the first aspect of the invention is to provide an efficient and compact laser device which, by means of an Er activator, takes the place of a gas laser and which, as being a shortwave laser, is opened to applications such as high density optical disks and high precision laser machining and processing.

It has been found that when a single crystal composition is obtained by mixing an impurity Er in a composition represented by a composition formula as YVO$_4$ and energy transitions of Er$^{3+}$ ions are utilized in the crystal composition, it is possible to obtain an Er:YVO$_4$ laser oscillation device in which a YVO$_4$ crystal capable of oscillating at the target wavelength is used as a laser host material. It has also been found that, by using a laser diode for the excitation source and by arranging the relative positions of the polarization direction of the laser diode oscillation light and the c-axis of the YVO$_4$ crystal to be perpendicular ($\sigma$-polarization) or parallel ($\pi$-polarization) to each other, it is possible to obtain a laser device in which spectral characteristics different depending on polarization directions are effectively utilized,.

Since the YVO$_4$ crystal is uniaxial, the spectral characteristics differ depending on the directions of the crystal axis. The luminescent characteristics of the Er:YVO$_4$ at the $\sigma$-polarization and the $\pi$-polarization have been demonstrated and made clear for the first time to the best knowledge of the inventors. That is, it has been found that, in the Er:YVO$_4$, the luminescence appears in wavelengths from 510 nm to 590 nm, from 840 nm to 870 nm, and from 970 nm to 1020 nm due to the polarization. The measured results of the luminescent characteristics of respective wavelengths at the $\sigma$-polarizations are shown in FIGS. 1, 2 and 3. It is seen that laser oscillations are obtainable at the respective wavelengths and the obtaining of the desired or targeted shortwave lengths has now been made possible.

When reference is made to the relevant information in "Applied Optics" of 1963, Vol. 2, page 675, it can be appreciated that the energy transitions of Er$^{3+}$ ions corresponding to respective wavelengths are as follows. That is, in obtaining the oscillations from 510 nm to 590 nm, there is no wavelength conversion step when $^4S_{3/2} \rightarrow {}^4I_{15/2}$ is used and, moreover, the laser oscillation spectrum obtained is very sharp as compared with that in glass, and less care for the growth environment is sufficient as compared with that for a fluoride crystal.

Next, by using $^4S_{3/2} \rightarrow {}^4I_{13/2}$, it is possible to obtain the oscillations from 840 nm to 870 nm by a four-level laser and not a three-level laser which involves a problem.

Further, by using $^4I_{11/2} \rightarrow {}^4I_{15/2}$, it is possible to obtain the oscillations from 970 nm to 1020 nm and this is because there occurs a deviation in the luminescent characteristics whereby the excitation state absorption can be avoided.

As a result, the Er:YVO$_4$ laser becomes laser media by the combination of the excitation media and the resonator, which makes it possible to cause the laser oscillations at shortwave regions of 510 nm–590 nm, 840 nm–870 nm, and 970 nm–1020 nm. The resonator herein refers to a Fabry-Perot interferometer in which two reflection mirrors, one being a high reflection mirror and the other an output mirror, are combined, and the same function is also obtained by mirror coatings corresponding to the target wavelengths.

In the Er:YVO$_4$ laser device which comprises the Er:YVO$_4$, the excitation media and the resonator, since the laser host material is YVO$_4$, the excitation light absorption characteristics are broad and not steep, and this makes it possible to expect the device to be more efficient, more compact and less complex.

According to FIG. 4 which is an energy level diagram of Er$^{3+}$ in the YVO$_4$ crystal, the energy transitions of the excited Er$^{3+}$ develop as below.

The laser oscillations of 510 nm–590 nm are due to the following energy transitions:

$^4I_{15/2} \rightarrow {}^4I_{9/2}$ (excitation by input light)
$^4I_{9/2} \rightarrow {}^4I_{11/2}$ (non-radiative transitions)
$^4I_{11/2} \rightarrow {}^2H_{11/2}$ (or $^4F_{7/2}$) (excited state absorption)
$^2H_{11/2}$ (or $^4F_{7/2}$) $\rightarrow {}^4S_{3/2}$ (non-radiative transitions)
$^4S_{3/2} \rightarrow {}^4I_{15/2}$ (stimulated emission) 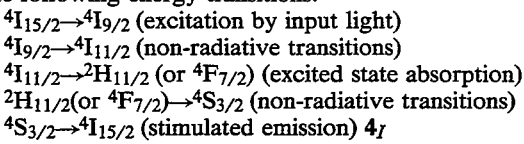

The laser oscillations of 840 nm–780 nm are due to the following two kinds of energy transitions:

$^4I_{15/2} \rightarrow {}^4I_{9/2}$ (excitation by input light)
$^4I_{9/2} \rightarrow {}^4\rightarrow {}^4I_{11/2}$ (non-radiative transitions)
$^4I_{11/2} \rightarrow {}^4F_{7/2}$ (energy transfer between $^4I_{11/2} \rightarrow {}^4I_{15/2}$ and excited ions)
$^4F_{7/2} \rightarrow {}^4S_{3/2}$ (non-radiative transitions)
$^4S_{3/2} \rightarrow {}^4I_{13/2}$ (stimulated emission) or
$^4I_{15/2} \rightarrow {}^4I_{9/2}$ (excitation by input light)
$^4I_{9/2} \rightarrow {}^4I_{13/2}$ (non-radiative transitions)
$^4I_{13/2} \rightarrow {}^2H_{11/2}$ (excited state absorption)
$^2H_{11/2} \rightarrow {}^4S_{3/2}$ (non-radiative transitions)
$^4S_{3/2} \rightarrow {}^4I_{13/2}$ (stimulated emission) 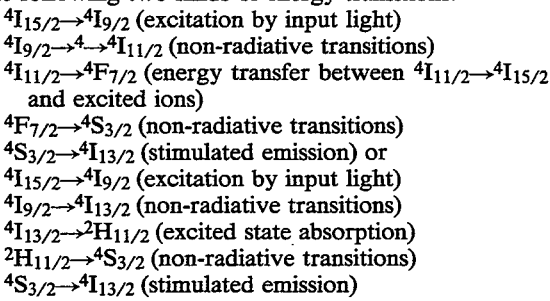

The laser oscillations of 970 nm–1020 nm are due to the following energy transitions:

$^4I_{15/2} \rightarrow {}^4I_{9/2}$ (excitation by input light)
$^4I_{9/2} \rightarrow {}^4I_{11/2}$ (non-radiation transitions)
$^4I_{11/2} \rightarrow {}^4I_{15/2}$ (stimulated emission) 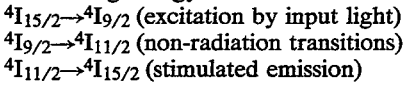

An object of the second aspect of the invention is to realize a highly efficient laser device in which an Er activator is utilized to allow oscillations at the best eye-safe wavelength region of 1.5 μm and in which a solid-state laser host uses YVO$_4$ thereby solving the problems encountered in a glass laser.

It has been found for the first time to the best knowledge of the inventors that, in the Er:YVO$_4$, the luminescence appears in wavelengths from 1450 nm to 1700 nm due to the polarizations ($\sigma$- and $\pi$-polarizations) as shown in FIGS. 8 and 9.

Thus, the Er:YVO$_4$ becomes the laser medium by the combination of the excitation medium and the resonator, thereby making it possible to obtain laser oscillations in the eye-safe region.

In the Er:YVO$_4$ laser device which comprises Er:YVO$_4$, the excitation media and the resonator, since the laser host is YVO$_4$, the device not only solves the problems existed in the Er glass laser but also offers advantages in providing sharp oscillation waves unique to a solid-state laser and in making the laser device compact and environmentally safe. Also, among solid-state lasers, the YVO$_4$ laser has particularly high absorption characteristics in its excitation light and this makes it possible to provide a further highly efficient, compact and simple device.

According to FIG. 10 which is an energy level diagram of Er$^{3+}$ in the YVO$_4$ crystal, the energy transitions of the excited Er$^{3+}$ develop as below. That is, the laser oscillations of 1450 nm–1700 nm are due to the following energy transitions:

$^4I_{15/2} \rightarrow ^4I_{9/2}$ (excitation by input light)

$^4I_{9/2} \rightarrow ^4I_{13/2}$ (non-radiative transition)

As above, after the stimulation to upper levels, the stimulated emission takes place to $^4I_{15/2}$ level, and the laser at a 1.5 μm band is oscillated.

An object of the third aspect of the invention is to provide a single crystal composition for a solid-state laser, which is featured by a composition formula of Er:YVO$_4$ with the YVO$_4$ crystal used as a host material and in which, by using Er as an activator, the solid-state laser can operate at shorter wavelengths or longer wavelengths than 1.06 μm which is the wavelength utilizing an energy level of Er and, moreover, can operate at higher efficiency than that in a YAG laser.

In the above manufacturing method, one of the features is that the composition is made from Er$_2$O$_3$, Y$_2$O$_3$ and V$_2$O$_5$ and is grown by a Czochralski method using a high frequency induction heating furnace.

Also, in the above manufacturing method, other features are that the growth direction of the composition is in the a-axis, the thermal treatment after the growth is performed in the neighborhood of the growth temperature, and the thermal treatment in the oxygen atmosphere is performed after the growth, whereby an Er:YVO$_4$ crystal having substantially no cracks and good transmittance is provided.

The luminescent characteristics on the irradiation of white light on the YVO$_4$ crystal have been found for the first time as shown in FIGS. 1, 2, 3, 8 and 9. As shown therein, the Er:YVO$_4$ exhibits sharp luminescence spectra unique to rare earth element ions at 553, 858, 980, 1500, 1520, 1530, 1530, 1540, 1555, 1565, 1580, 1595 and 1605 (nm), and that laser oscillations are obtained in the given wavelength bands, namely, 510–590, 840–870, 970–1020, 1450–1700 (nm). At the targeted shortwave lengths, it has been made possible to obtain a green laser at the band of 550 nm, and a blue laser due to a second harmonic generation by utilizing a combination of laser beams oscillated at the bands of 858 and 980 nm and a nonlinear optical crystal. The oscillation wavelengths from 1450 nm to 1700 nm are known as being an eye-safe wavelength region, and it has been confirmed that such longer wavelengths can be obtained.

Also, it has been confirmed that, in the growth of the Er:YVO$_4$ crystal, the method of growing the crystal can be improved in the ways explained hereinbelow.

Firstly, it has been made possible to perform the growth in the direction of the a-axis which was difficult in the prior art and, as compared with the results of the growth in the direction of c-axis shown in FIG. 11A, the transmittance characteristics of the grown crystal according to the invention have been improved as seen in FIG. 11B. Thus, it follows that, when the resulting laser crystal is used, it is possible to prevent the crystal from absorbing the heat generated on laser oscillations and also to prevent the resonator length from deviating on rising of crystal temperatures.

Secondly, after the growth of the composition, a thermal treatment or annealing is performed under the temperatures of 1500°–1700° C. which temperatures are in the neighborhood of the growth temperatures. This treatment eliminates strains developed during the growth so that the cracks to occur after the growth can be prevented. Since the occurrence of cracks is thus prevented, the yield of the chips cut out from the crystal is enhanced.

Thirdly, after the growth of the composition, a thermal treatment is performed in an oxygen atmosphere. It has been confirmed that, as shown in FIG. 12B, the transmittance characteristics of the Er:YVO$_4$ after the thermal treatment are improved over those before the thermal treatment as shown in FIG. 12A. Thus, it follows that, when the resulting laser crystal is used, it is possible to prevent the crystal from absorbing the heat generated on laser oscillations and also to prevent the resonator length from deviating on rising of crystal temperatures.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF PREFERRED EMBODIMENTS

Throughout the following explanation, similar reference symbols or numerals refer to the same or similar elements in all the figures of the drawings.

Also, the expressions, the a-axis and the c-axis, used in the description and drawings in making reference to the directions of the crystal axis are common expressions as defined, for example, in "Acta Crystallographia", Section B, Vol. B40, 1984, pages 569–574.

Now, preferred embodiments of the invention are explained with reference to the drawings.

First, a chip of $3 \times 3 \times 5$ mm$^3$ is cut out from an Er:YVO$_4$ crystal containing 1 at. % of Er and is subjected to optical polishing. This is then fixed to the device for laser operation.

Figure 1:
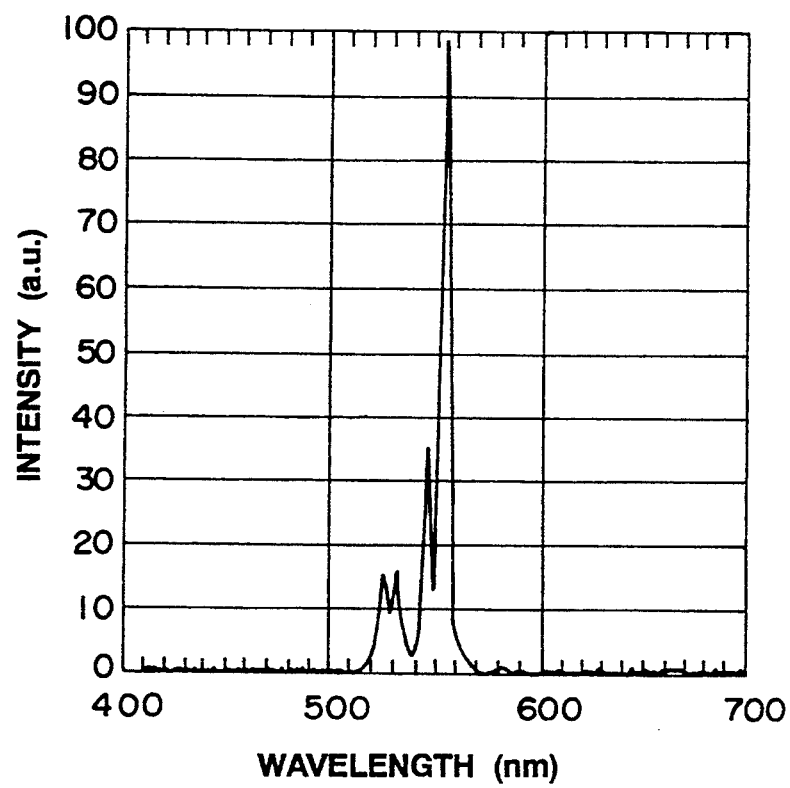
FIG. 1 is a diagram showing Er:YVO$_4$ luminescent characteristics with σ-polarization in a range from 510 nm to 590 nm.
Figure 2:
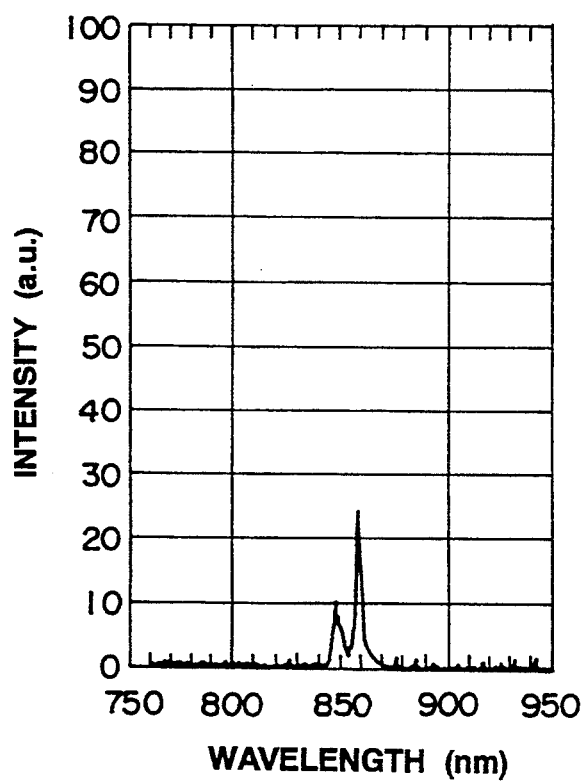
FIG. 2 is a diagram showing Er:YVO$_4$ luminescent characteristics with σ-polarization in a range from 840 nm to 870 nm.
Figure 3:
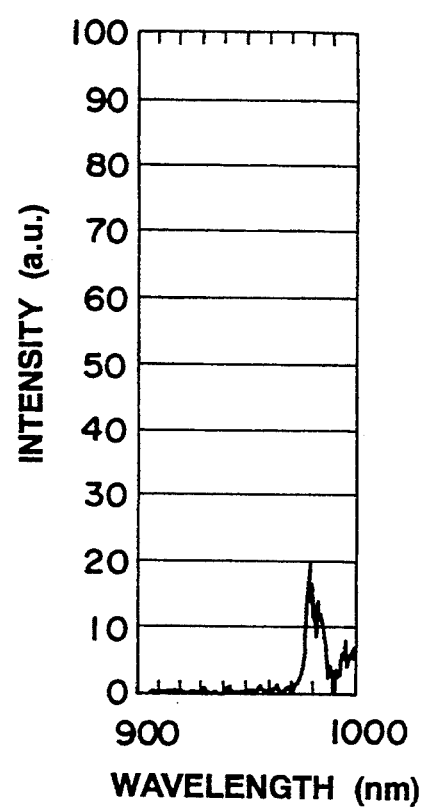
FIG. 3 is a diagram showing Er:YVO$_4$ luminescent characteristics with σ-polarization in a range from 970 nm to 1020 nm.
Figure 4:
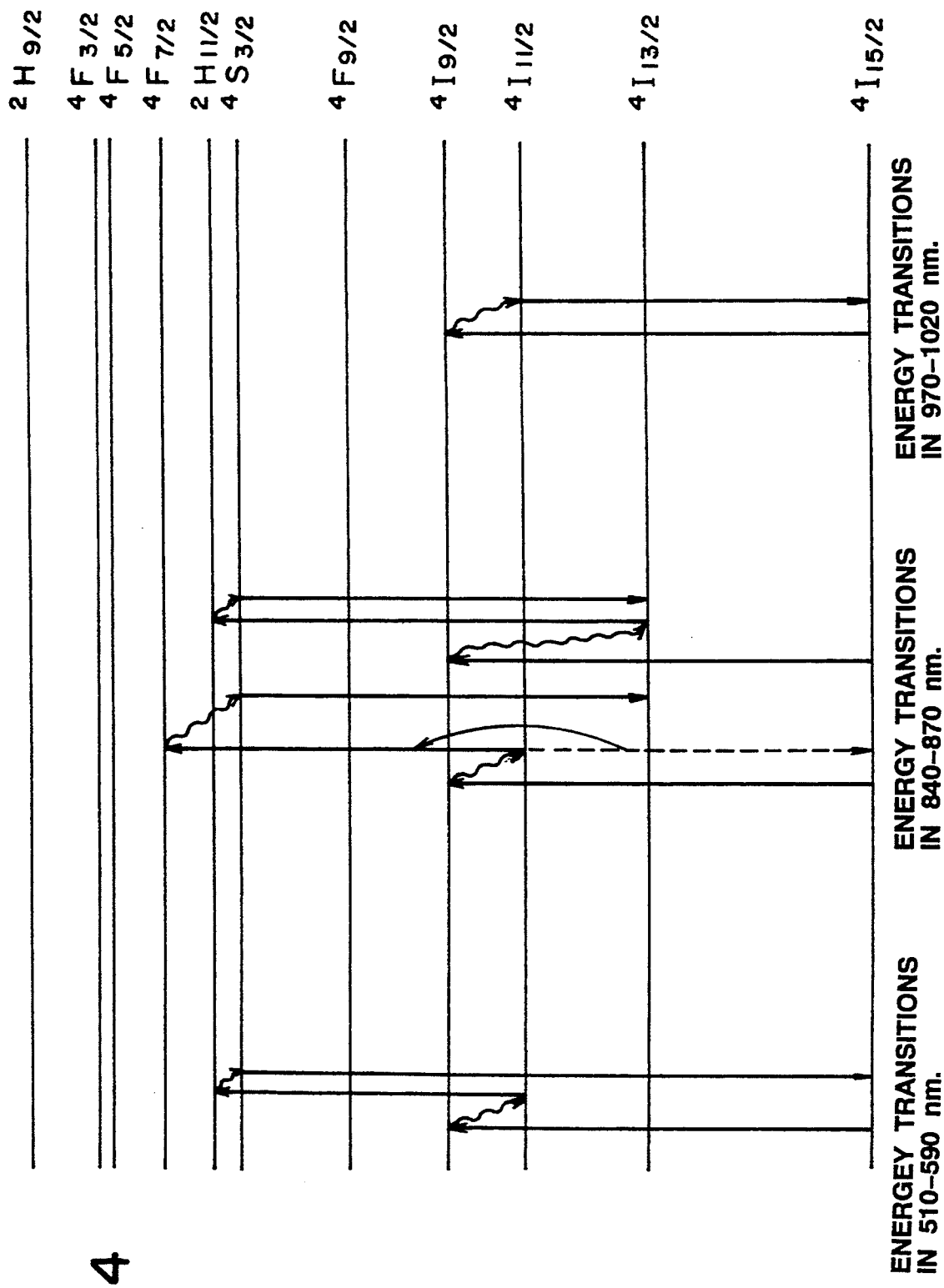
FIG. 4 is a diagram showing energy levels of Er$^{3+}$ ions in the YVO$_4$ crystal (510 nm–1020 nm)
Figure 5:
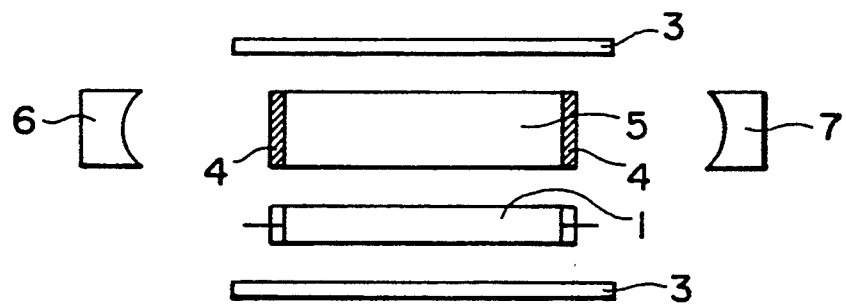
FIG. 5 is a diagram showing an arrangement of various elements of a laser oscillator of a first embodiment according to the invention.

FIG. 5 diagrammatically shows arrangements of the laser oscillation device of a first embodiment according to the invention. The excitation source of laser oscillation is a flashlamp 1 or a laser diode 2. The flashlamp exciting oscillation device shown in FIG. 5 is arranged such that the excitation light is, by means of a lamp house 8, irradiated on an Er:YVO$_4$ crystal 5 which is multi-coated with fluoride megnesium-zeolite system antireflection coatings 4 each corresponding to the target wavelength, and a reflection mirror 6 and an output mirror 7 constitute a resonator configuration.

Figure 6:
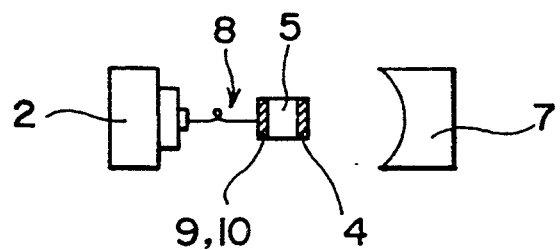
FIG. 6 is a diagram showing an arrangement of various elements of a laser oscillator of a second embodiment according to the invention.

FIG. 6 shows the laser oscillation device of the second embodiment of the invention, in which the light source is a laser diode 2 and the excitation light is irradiated on an Er:YVO$_4$ crystal 5 through an optical fiber 8. The Er:YVO$_4$ crystal 5 shown in FIG. 6 is coated with a TiO$_2$-SiO$_2$ system high reflection mirror coating 9 and a fluoride megnesium-zeolite system antireflection coating 4, each corresponding to the target wavelength, and a fluoride megnesium-zeolite system antireflection coating 10 corresponding to the oscillation wavelength (807 nm) of the laser diode. These coatings together with an output mirror 7 constitute a resonator configuration. A concave lens is used as the output mirror for paralleling output beams.

Figure 7:
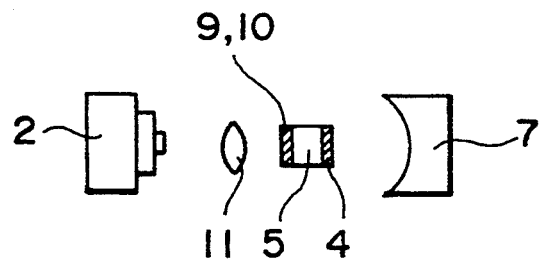
FIG. 7 is a diagram showing an arrangement of various elements of a laser oscillator of a third embodiment according to the invention.
Figure 8:
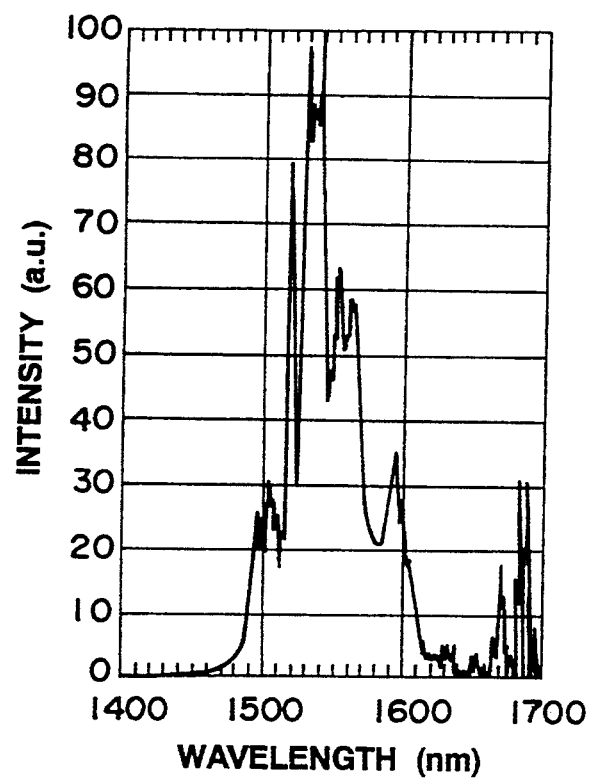
FIG. 8 is a diagram showing Er:YVO$_4$ luminescent characteristics in a range from 1450 nm to 1700 nm at the σ-polarization.
Figure 9:
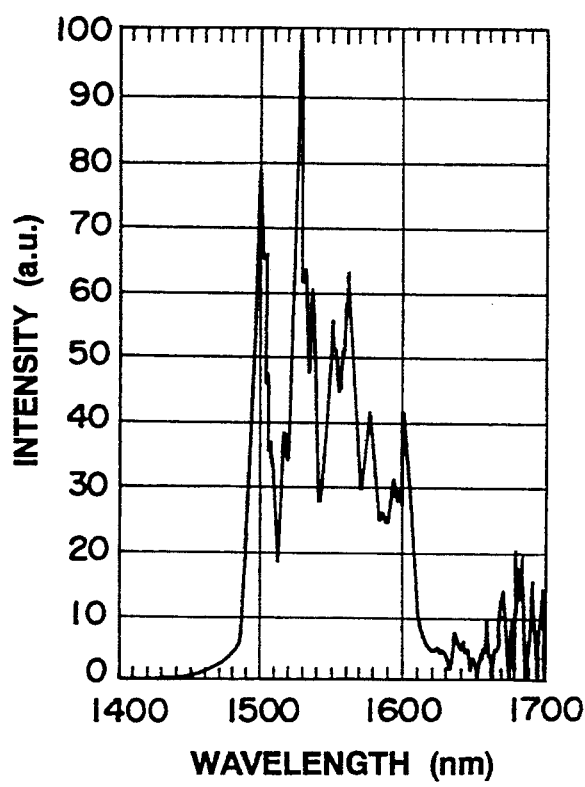
FIG. 9 is a diagram showing Er:YVO$_4$ luminescent characteristics in a range from 1450 nm to 1700 nm at the π-polarization.
Figure 10:
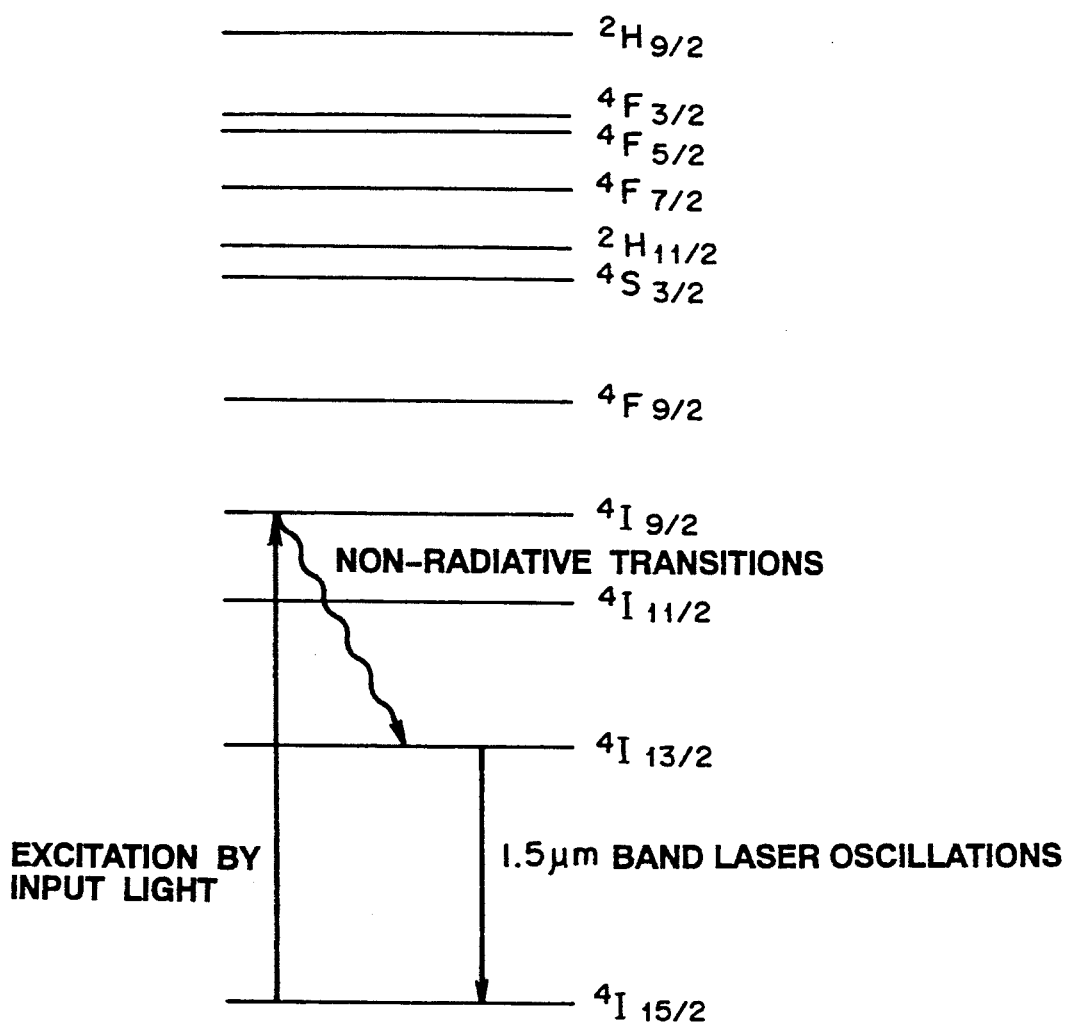
FIG. 10 is a diagram showing energy levels of Er$^{3+}$ ions in the YVO$_4$ crystal (1400 nm–1700 nm)

FIG. 7 illustrates the laser oscillation device of the third embodiment according to the invention. The excitation source of laser oscillation is a laser diode 2. The excitation light is irradiated on an Er:YVO$_4$ crystal 5 through a beam-condensing lens 11. Here, in order to effectively utilize the spectral characteristics due to differences in the polarization directions of the Er:YVO$_4$ crystal 5, it is arranged that the oscillation light of the laser diode 2 is perpendicular ($\sigma$-polarization) or parallel ($\pi$-polarization) to the c-axis of the Er:YVO$_4$. The Er:YVO$_4$ crystal 5 shown in FIG. 7 is coated with a TiO$_2$-SiO$_2$ system high reflection mirror coating 9 and a fluoride megnesium-zeolite system antireflection coating 4 each corresponding to the target wavelength, and a fluoride megnesium-zeolite system antireflection coating 10 corresponding to the oscillation wavelength (807 nm) of a laser diode 2 as the excitation light source. These coatings together with an output mirror 7 constitute a resonator configuration. A concave lens is used as the output mirror for paralleling output beams.

By the laser oscillation devices according to the foregoing first, second and third embodiments, the laser oscillation beams with the wavelengths respectively of 553 nm, 858 nm and 980 nm have been obtained. It has been confirmed that the stability of the laser oscillation is very high.

Thus, the first aspect of the invention makes it possible to provide a highly efficient shortwave solid-state laser in which an activator is Er and a laser host material is YVO$_4$ and which oscillates in a range from 510 nm to 590 nm, from 840 nm to 870 nm, and from 970 nm to 1020 nm.

The oscillation wavelength band of 510 nm to 590 nm meets a recent demand for shortwave laser beams. Thus, this makes it possible to realize a green laser with a single solid-state laser unit and to provide a compact shortwave laser device with high efficiency and reliability. Also, a second harmonic generation which is produced by irradiating on a nonlinear optical crystal the laser beam oscillated in a range from 840 nm to 870 nm makes it possible to realize a blue laser and to provide a compact shortwave laser device with high efficiency and reliability. Further, a second harmonic generation which is produced by irradiating on a nonlinear optical crystal the laser beam oscillated in a range from 970 nm to 1020 nm makes it possible to realize a green laser and to provide a compact shortwave laser device with high efficiency and reliability. These shortwave laser devices are opened to applications such as high density optical disks, laser machining and processing, medical uses and scientific measurements.

The second aspect of the invention provides a solid-state laser in which the laser oscillations of 1450 nm -1700 nm are achieved. This has made it possible to provide a highly efficient and compact eye-safe laser device, which is opened to wide applications in many fields, particularly in the field in which a laser is used in an atmosphere.

Now, some examples of the solid-state laser materials and methods for manufacturing the same are explained below.

EXAMPLE 1

Y$_2$O$_3$, V$_2$O$_5$ are weighed to become a stoichiometric composition of YVO$_4$ and Er$_2$O$_3$ is weighed to become 1 at. % of yttrium ions of YVO$_4$, the latter being mixed into the former powder. This mixed powder is subjected to hydrostatic pressure press to produce a pressed body, and this pressed body is placed in an iridium crucible. An Er:YVO$_4$ single crystal was grown using the Czochralski type apparatus having a radio frequency heater. The seed was rotated at 10 rpm, the pulling rate is 0.6–1.0 mm/hr, the atmosphere is N$_2$ gas containing 0.2% O$_2$ gas, and the growth direction is in the c-axis. Semiconductor laser beams having center oscillation frequencies of 807 nm have been irradiated on a chip of $3 \times 3 \times 5$ mm$^3$ which has been cut out from the grown crystal and polished, and the laser oscillation thereof at 1620 nm has been confirmed.

EXAMPLE 2

Figure 11A:
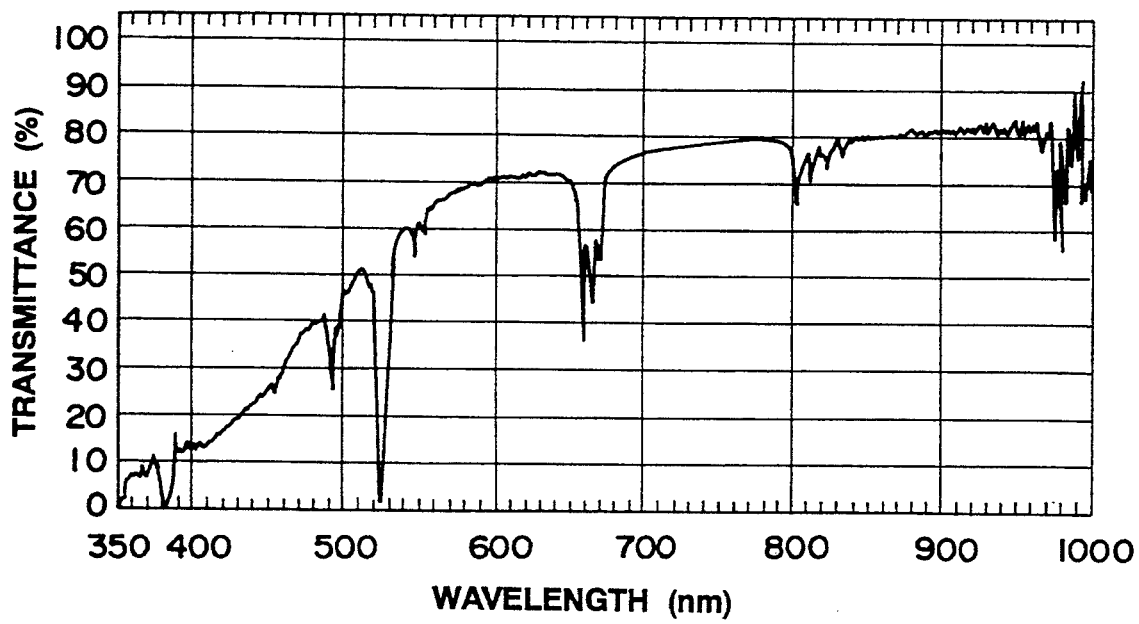
FIGS. 11A and 11B are diagrams intended to show differences in transmittance characteristics depending on growth of Er:YVO$_4$ in the c-axis and the a-axis.
Figure 11B:
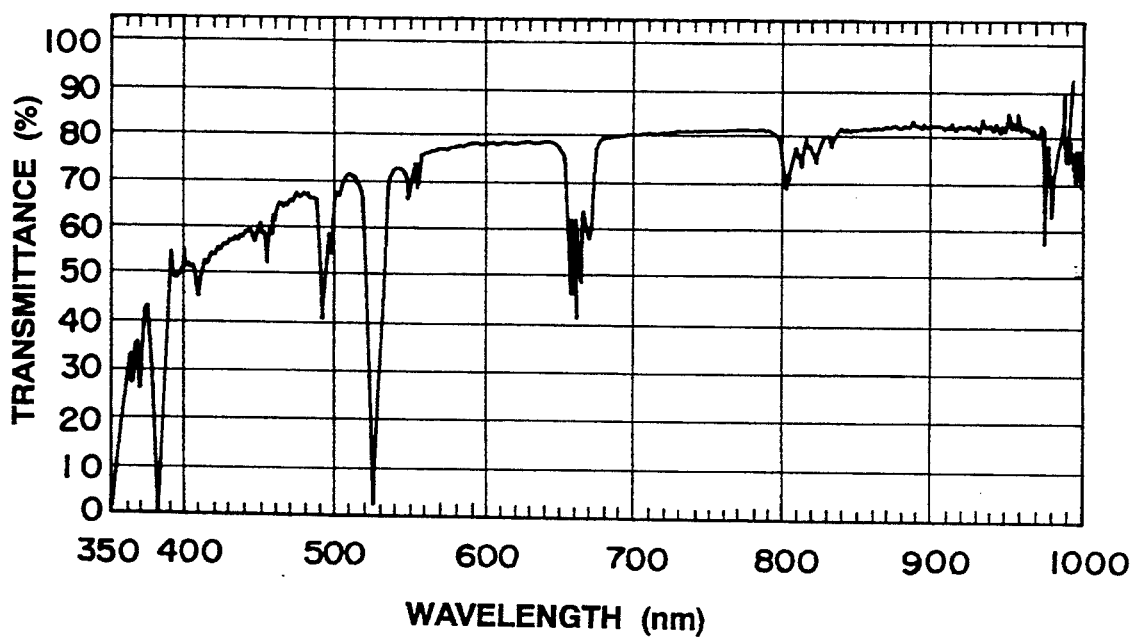

Y$_2$O$_3$, V$_2$O$_5$ are weighed to become a stoichiometric composition of YVO$_4$ and Er$_2$O$_3$ is weighed to become 1 at. % of yttrium ions of YVO$_4$, the latter being mixed into the former powder. This mixed powder is subjected to hydrostatic pressure press to produce a pressed body, and this pressed body is placed in an iridium crucible. An Er:YVO$_4$ single crystal was grown using the Czochralski type apparatus having a radio frequency heater. The seed was rotated at 10 rpm, the pulling rate is 0.6–1.0 mm/hr, the atmosphere is N$_2$ gas containing 0.2% O$_2$ gas, and the growth direction is in the a-axis. Semiconductor laser beams having center oscillation frequencies of 807 nm have been irradiated on a chip of $3\times3\times5$ mm$^3$ which has been cut out from the grown crystal and polished, and the laser oscillation thereof at 1620 nm has been confirmed. The advantage achieved by the growth in the direction of the a-axis is that, as seen in FIG. 11B, the transmittance in the chip is good, and it has been confirmed that fluctuations in the resonance lengths caused by heat absorption in the chip to occur on laser oscillations are small.

EXAMPLE 3

$Y_2O_3$, $V_2O_5$ are weighed to become a stoichiometric composition of $YVO_4$ and $Er_2O_3$ is weighed to become 1 at. % of yttrium ions of $YVO_4$, the latter being mixed into the former powder. This mixed powder is subjected to hydrostatic pressure press to produce a pressed body, and this pressed body is placed in an iridium crucible. An Er:YVO$_4$ single crystal was grown using the Czochralski type apparatus having a radio frequency heater. The seed was rotated at 10 rpm, the pulling rate is 0.6–1.0 mm/hr, the atmosphere is $N_2$ gas containing 0.2% $O_2$ gas, and the growth direction is in the a-axis. After the growth, a thermal treatment is performed under the temperature of 1600° C. for 20 hours. This treatment has eliminated strains during the growth and has substantially prevented the cracks to occur after the growth. Thus, the yield of the chips cut out from the crystal is greatly enhanced. Semiconductor laser beams having center oscillation frequencies of 807 nm have been irradiated on a chip of $3\times3\times5$ mm$^3$ which has been cut out from the grown crystal and polished, and the laser oscillation thereof at 1620 nm has been confirmed.

EXAMPLE 4

Figure 12A:
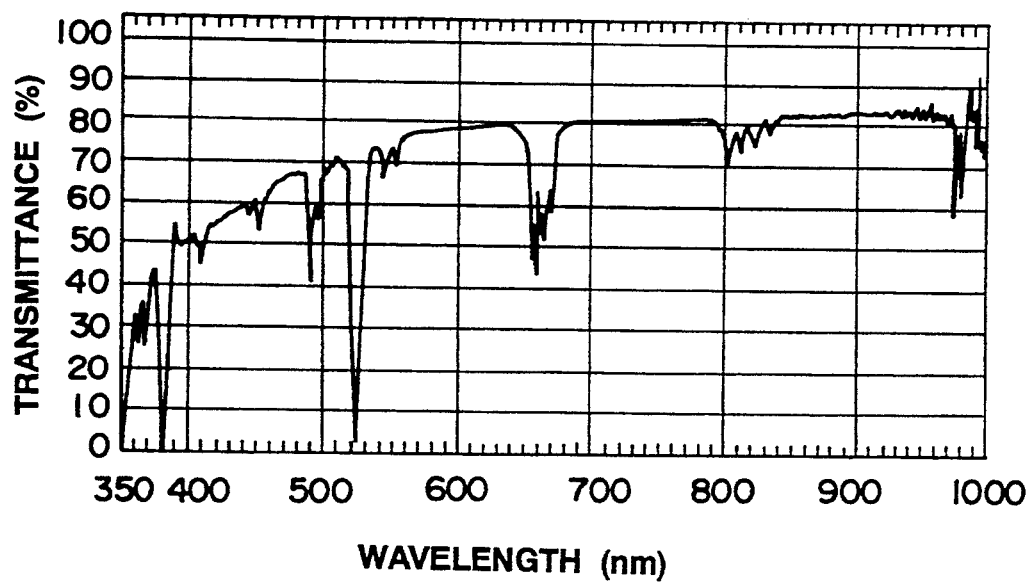
FIGS. 12A and 12B are diagrams intended to show differences in transmittance characteristics before and after the annealing of Er:YVO$_4$ in oxygen atmosphere.
Figure 12B:
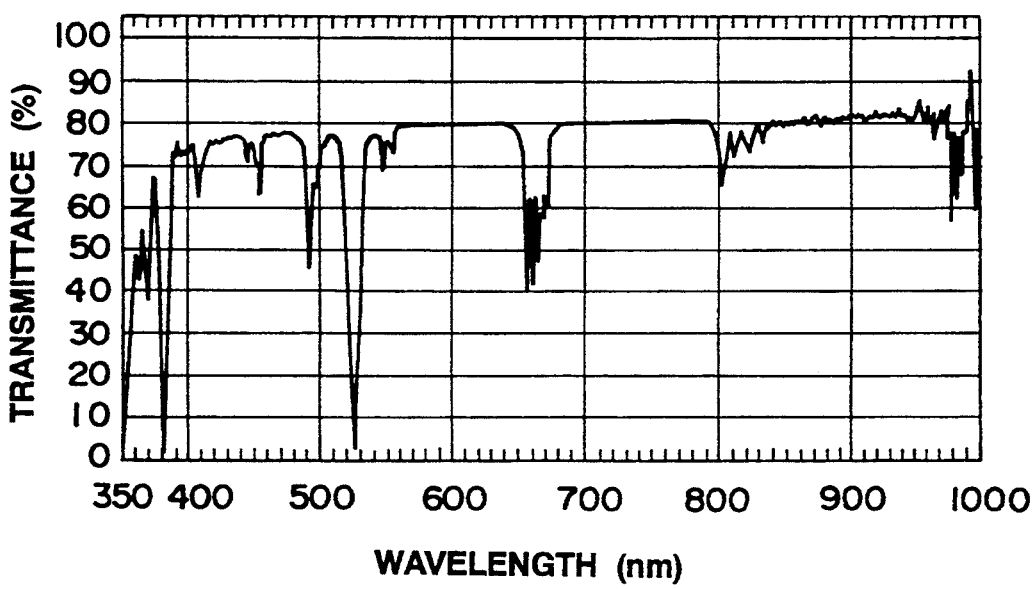

$Y_2O_3$, $V_2O_5$ are weighed to become a stoichiometric composition of $YVO_4$ and $Er_2O_3$ is weighed to become 1 at. % of yttrium ions of $YVO_4$, the latter being mixed into the former powder. This mixed powder is subjected to hydrostatic pressure press to produce a pressed body, and this pressed body is placed in an iridium crucible. An Er:YVO$_4$ was grown using the Czochralski type apparatus having a radio frequency heater. The seed was rotated at 10 rpm, the pulling rate is 0.6–1.0 mm/hr, the atmosphere is $N_2$ gas containing 0.2% $O_2$ gas, and the growth direction is in the a-axis. The grown crystal is cut into a wafer having a thickness of 8 mm, and the wafer is placed in an open duct into which oxygen is being introduced, and the wafer together with the duct is subjected to thermal treatment under the temperature of 110° C. for 12 hours. Semiconductor laser beams having center oscillation frequencies of 807 nm have been irradiated on a chip of $3\times3\times5$ mm$^3$ which has been cut out from the grown crystal and polished, and the laser oscillation thereof at 1620 nm has been confirmed. The advantage achieved by the growth in the direction of the a-axis is that, as seen in FIG. 12B, the transmittance in the chip is good, and it has been confirmed that fluctuations in the resonance lengths caused by heat absorption in the chip to occur on laser oscillations are small.

The present invention has thus made it possible to achieve a highly efficient solid-state laser which is capable of oscillating at oscillation wavelengths other than 1.06 μm which has been a standard solid-state laser oscillation wavelength in the prior art. At these oscillation wavelengths, it is possible to obtain a green laser, a near infrared laser and an eye-safe laser by the solid-state laser according to the invention. Also, with the second harmonic generation obtained by irradiating the near infrared laser beam on the nonlinear optical crystal, it is possible to obtain a blue laser as well. The green laser and the blue laser have applications to writing/reading on optical disks and to laser machining and processing, and also applications to meet changes from argon laser for uses such as in medical and scientific measurement fields.

Whereas, conventionally, it has been difficult to grow a crystal of good quality, the present invention has made it possible to produce a single laser crystal of YVO$_4$ with an improved quality and enhanced yield.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An Er:YVO$_4$ laser oscillator comprising:
    an excitation light source;
    a medium constituted by an Er:YVO$_4$ crystal which is irradiated by light from said excitation light source and in which Er$^{3+}$ ions are activators, said Er:YVO$_4$ crystal being in a single crystal composition with an impurity Er mixed into a composition represented by a formula of YVO$_4$; and
    a laser resonator which is in a resonating relationship with respect to said Er:YVO$_4$ crystal,
    whereby said laser oscillator oscillates in target wavelengths by the utilization of energy, transitions of said Er$^{3+}$ ions of said single crystal composition.

2. An Er:YVO$_4$ laser oscillator according to claim 1, in which said laser oscillator is operable in target wavelengths from 510 nm to 590 nm by utilization of energy transitions $^4S_{3/2} \rightarrow {^4I_{15/2}}$ of Er$^{3+}$ ions.

3. An Er:YVO$_4$ laser oscillator according to claim 1, in which said laser oscillator is operable in target wavelengths from 840 nm to 870 nm by utilization of energy transitions $^4S_{3/2} \rightarrow {^4I_{13/2}}$ or Er$^{3+}$ ions.

4. An Er:YVO$_4$ laser oscillator according to claim 1, in which said laser oscillator is operable in target wavelengths from 970 nm to 1020 nm by utilization of energy transitions $^4S_{11/2} \rightarrow {^4I_{15/2}}$ of Er$^{3+}$ ions.

5. An Er:YVO$_4$ laser oscillator according to claim 1, in which said laser oscillator is operable in target wavelengths from 1450 nm to 1700 nm by utilization of energy transitions $^4S_{13/2} \rightarrow {^4I_{15/2}}$ of ER$^{3+}$ ions.

6. An Er:YVO$_4$ laser oscillator according to claim 1, in which said excitation light source is a flashlamp; said Er:YVO$_4$ crystal is coated with fluoride megnesium-zeolite system antireflection coatings each corresponding to said target wavelengths; and said laser resonator is constituted by a reflection mirror and an output mirror.

7. An Er:YVO$_4$ laser oscillator according to claim 1, which comprises an optical fiber and in which said excitation light source is constituted by a laser diode for irradiating the light on said Er:YVO$_4$ crystal through said optical fiber; said Er:YVO$_4$ crystal is coated with a TiO$_2$-SiO$_2$ system high reflection mirror coating and a fluoride megnesium-zeolite system antireflection coating respectively corresponding to said target wavelengths, and a fluoride megnesium-zeolite system antireflection coating corresponding to a wavelength of the light from said laser diode; and said laser resonator is constituted by an output mirror together with said TiO$_2$-SiO$_2$ system high reflection mirror coating, said antireflection coating and said fluoride megnesium-zeolite system antireflection coating.

8. An Er:YVO$_4$ laser oscillator according to claim 1, which comprises a beam-condensing lens and in which said excitation light source is constituted by a laser diode for irradiating the light on said Er:YVO$_4$ crystal through said beam-condensing lens; said Er:YVO$_4$ crystal is coated with a TiO$_2$-SiO$_2$ system high reflection mirror coating and a fluoride megnesium-zeolite system antireflection coating respectively corresponding to said target wavelengths, and a fluoride megnesium-zeolite system antireflection coating corresponding to a wavelength of said laser diode; and said laser resonator is constituted by an output mirror together with said TiO$_2$-SiO$_2$ system high reflection mirror coating, said antireflection coating and said fluoride megnesium-zeolite system antireflection coating.

9. An Er:YVO$_4$ laser oscillator according to claim 1, in which said excitation light source is constituted by a laser diode, and the direction of polarization of laser oscillation beams of said laser diode is perpendicular to a c-axis of YVO$_4$ crystal.

10. An Er:YVO$_4$ laser oscillator according to claim 1, in which said excitation light source is constituted by a laser diode, and the direction of polarization of laser oscillation beams of said laser diode is parallel to a c-axis of YVO$_4$ crystal.

11. A single crystal for use in a solid-state laser, comprising:
a composition represented by a composition formula of YVO$_4$; and
an impurity Er$^{3+}$ mixed into said composition,
wherein said Er$^{3+}$ ions being used as activators and said YVO$_4$ being used as a host material.

* * * * *